(12) United States Patent
Kawano et al.

(10) Patent No.: US 10,651,349 B2
(45) Date of Patent: *May 12, 2020

(54) LIGHT EMITTING DEVICE

(71) Applicant: NICHIA CORPORATION, Anan-shi, Tokushima (JP)

(72) Inventors: Kenji Kawano, Tokushima (JP); Atsushi Yamamoto, Komatsushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/059,709

(22) Filed: Aug. 9, 2018

(65) Prior Publication Data

US 2018/0351051 A1 Dec. 6, 2018

Related U.S. Application Data

(63) Continuation of application No. 14/859,980, filed on Sep. 21, 2015, now Pat. No. 10,074,782.

(30) Foreign Application Priority Data

Sep. 24, 2014 (JP) .................. 2014-193509

(51) Int. Cl.
*H01L 33/50* (2010.01)
*G02F 1/1335* (2006.01)
(Continued)

(52) U.S. Cl.
CPC .......... *H01L 33/504* (2013.01); *C09K 11/025* (2013.01); *C09K 11/62* (2013.01);
(Continued)

(58) Field of Classification Search
CPC ................. H01L 33/504; H01L 33/507; G02F 1/133514; G02F 1/133528;
(Continued)

(56) References Cited

U.S. PATENT DOCUMENTS 10,074,782 B2 * 9/2018 Kawano ................ H01L 33/504
2006/0226759 A1 10/2006 Masuda et al.
(Continued)

FOREIGN PATENT DOCUMENTS

CN 103597568 A 2/2014
CN 103681990 A 3/2014
(Continued)

OTHER PUBLICATIONS

Naoto Hirosaki,! Rong-Jun Xie, and Koji Kimoto; Characterization and properties of green-emitting b-SiAlON:Eu2+ powder phosphors for white light-emitting diodes, Applied Physics Letters 86, 211905-1 to 211905-3, 2005, (Year: 2005).*
(Continued)

*Primary Examiner* — Bijan Ahvazi
(74) *Attorney, Agent, or Firm* — Hunton Andrews Kurth LLP

(57) ABSTRACT

A light emitting device includes a light emitting element adapted to emit blue light, quantum dots that absorb part of the blue light emitted from the light emitting element to emit green light, and at least one of a KSF phosphor adapted to absorb part of the blue light emitted from the light emitting element to emit red light and a MGF phosphor adapted to absorb part of the blue light emitted from the light emitting element to emit red light.

13 Claims, 8 Drawing Sheets

(51) Int. Cl.
*C09K 11/02* (2006.01)
*C09K 11/62* (2006.01)
*C09K 11/66* (2006.01)
*C09K 11/88* (2006.01)
*F21V 8/00* (2006.01)
*G02F 1/13357* (2006.01)

(52) U.S. Cl.
CPC .......... *C09K 11/663* (2013.01); *C09K 11/883* (2013.01); *G02B 6/0073* (2013.01); *G02F 1/133514* (2013.01); *G02F 1/133528* (2013.01); *G02F 1/133617* (2013.01); *G02F 2001/133614* (2013.01); *H01L 33/507* (2013.01)

(58) Field of Classification Search
CPC ... G02F 1/133617; G02F 2001/133614; G02F 1/133614; G02F 2001/133617; C09K 11/025; C09K 11/62; C09K 11/663; C09K 11/883; G02B 6/0073
See application file for complete search history.

(56) References Cited

U.S. PATENT DOCUMENTS

| | | |
|---|---|---|
| 2007/0241657 A1 | 10/2007 | Radkov et al. |
| 2008/0105887 A1 | 5/2008 | Narendran et al. |
| 2010/0142189 A1* | 6/2010 | Hong .................. C09K 11/616 362/97.3 |
| 2010/0193806 A1 | 8/2010 | Byun |
| 2012/0256163 A1 | 10/2012 | Yoon et al. |
| 2013/0070443 A1 | 3/2013 | Pan et al. |
| 2014/0022779 A1 | 1/2014 | Su et al. |
| 2015/0214445 A1 | 7/2015 | Qiu et al. |
| 2015/0380613 A1 | 12/2015 | Hiramatsu et al. |
| 2016/0097495 A1* | 4/2016 | Yamamoto .......... G02B 6/0073 349/65 |

FOREIGN PATENT DOCUMENTS

| | | | |
|---|---|---|---|
| EP | 2988340 A1 | 2/2016 | |
| JP | 2004071357 A | 3/2004 | |
| JP | 2005228996 A | 8/2005 | |
| JP | 2007199141 A | 8/2007 | |
| JP | 2007224233 A | 9/2007 | |
| JP | 2008544553 A | 12/2008 | |
| JP | 2009231273 A | 10/2009 | |
| JP | 2009289829 A | 12/2009 | |
| JP | 2010177656 A | 8/2010 | |
| JP | 2010209311 A | 9/2010 | |
| JP | 2013534042 A | 8/2013 | |
| WO | 2007002234 A1 | 1/2007 | |
| WO | WO-2007002234 A1 * | 1/2007 | ............ B82Y 10/00 |
| WO | 2014141852 A1 | 9/2014 | |

OTHER PUBLICATIONS

Office Action issued in European Patent Application No. 15186267.9 dated Feb. 8, 2017.

N. Hirosaki et al., "Characterization and properties of green-emitting Beta-SiAlON: Eu2+ powder phosphors for white light-emitting diodes," Applied Physics Letters 86, 211905 (2005). From EESR Feb. 23, 2016.

Extended European Search Report dated Feb. 23, 2016 in European Application No. 15186267.9.

\* cited by examiner

LIGHT EMITTING DEVICE

CROSS-REFERENCE TO RELATED PATENT APPLICATION

This is a continuation application of U.S. patent application Ser. No. 14/859,980, filed Sep. 21, 2015 which claims priority to Japanese Patent Application 2014-193509 filed on Sep. 24, 2014, the disclosure of which is incorporated herein by reference in its entirety.

BACKGROUND

Technical Field

The present invention relates to light emitting devices, and more particularly to a light emitting device which includes a light emitting element that emits a blue light, and quantum dots that emit a green light by absorbing part of the blue light emitted from the light emitting element.

Description of the Related Art

Conventionally, light emitting devices that emit white light are known. This type of light emitting device includes a light emitting element that emits a blue light, a green phosphor that emits a green light (or a yellow-green phosphor that emits a yellow-green light) by absorbing part of the blue light emitted from the light emitting element, and a red phosphor that emits a red light by absorbing part of the blue light emitted from the light emitting element. Such a light emitting device that emits a white light is used for various applications, including illumination devices and backlights for various displays, such as a liquid crystal display.

In recent years, light emitting devices having all or part of the phosphor replaced by quantum dots (QDs) have been developed. A quantum dot is a semiconductor particle having a diameter of several nanometers to tens of nanometers, and can absorb light such as a blue light emitted from a light emitting element and emit a light different from the absorbed light, as seen in a phosphor. A light emitting device which includes green quantum dots to absorb a blue light emitted from a light emitting element to emit a green light and red quantum dots to absorb a blue light emitted from the light emitting element to emit a red light is also known. For example, JP 2008-544553 A discloses a light emitting device that includes a yellow-green phosphor and red quantum dots.

The quantum dot features a sharp emission peak, that is, a small (narrow) full width at half maximum of the emission peak. Thus, the light emitting device using the quantum dots has an advantage of a wide color reproducibility range when combined with a color filter of a liquid crystal display or the like. Further, matching the peak wavelength of the color filter (a wavelength at which its transmittance reaches a peak) to the emission peak of the quantum dots allow for more light to pass through the color filter, which improves the light extraction efficiency with less attenuation of the light in use of the color filter. In particular, conventional green phosphors and yellow-green phosphors have the respective broad emission peaks. Thus, by use of the green quantum dots, these effects can be remarkably exhibited.

However, these conventional light emitting devices employing the quantum dots are designed to use red quantum dots and may lead to the occurrence of secondary absorption. That is, the red quantum dots may absorb part of green, or yellow-green, light emitted from green quantum dots or a green, or yellow-green, phosphor that has absorbed the blue light, and then emit a red light. The occurrence of such secondary absorption leads to a reduction in the luminous efficiency of the whole light emitting device. Further, in many applications such as displays and illumination devices, there has arisen a need for a light emitting device that can emit brighter light with lower power consumption, that is, which has high luminance efficiency.

SUMMARY

It is an object of the present invention to provide a light emitting device that achieves the high luminous efficiency while utilizing quantum dots, especially, green quantum dots.

According to embodiments of the present invention, a light emitting device comprises a light emitting element adapted to emit blue light; a plurality of quantum dots adapted to absorb a portion of the blue light emitted from the light emitting element to emit green light; and at least one of a KSF phosphor and a MGF phosphor, wherein the KSF phosphor is a compound having the chemical formula $A_2[M_{1-a}Mn^{4+}{}_aF_6]$ (1), where A is at least one selected from the group consisting of $K^+$, $Li^+$, $Na^+$, $Rb^+$, $Cs^+$, and $NH^{4+}$, M is at least one element selected from the group consisting of Group 4 elements and Group 14 elements, and $0<a<0.2$; and the KSF phosphor is adapted to absorb at least a portion of the blue light emitted from the light emitting element to emit red light; wherein the MGF phosphor is a compound having the chemical formula $(x-a)MgO\cdot(a/2)Sc_2O_3\cdot yMgF_2\cdot cCaF_2\cdot (1-b)GeO_2\cdot(b/2)Mt_2O_3{:}zMn^{4+}$ (2), where $2.0 \leq x \leq 4.0$, $0<y<1.5$, $0<z<0.05$, $0 \leq a<0.5$, $0<b<0.5$, $0 \leq c<1.5$, $y+c<1.5$, and Mt is at least one element selected from Al, Ga and In; and the MGF phosphor is adapted to absorb at least a portion of the blue light emitted from the light emitting element to emit red light.

In an embodiment, a liquid crystal display device, comprises a light emitting element device, wherein the light emitting device comprises a light emitting element adapted to emit blue light, the light emitting element disposed on a surface of a light emitting element package; a sealing resin covering the light emitting element, the sealing resin including at least one of a KSF phosphor and a MGF phosphor, wherein the KSF phosphor and a MGF phosphor are adapted to absorb at least a portion of the blue light emitted from the light emitting element to emit red line; and a plurality of quantum dots adapted to absorb a portion of the blue light emitted from the light emitting element to emit green light; a light guide plate having an upper and lower surface, the light guide plate disposed between the sealing resin and the light emitting element package; a reflective plate disposed facing the lower surface of the light guide plate; a quantum dot layer disposed facing the upper surface of the light guide plate, the quantum dot layer including the plurality of quantum dots; a lower polarizing film disposed on the quantum dot layer; a liquid crystal cell disposed on the lower polarizing film; a color filter array disposed on the liquid crystal cell; and an upper polarizing film disposed on the color filter array.

Embodiments of the present invention may be more fully understood from the description of the preferred embodiments as set forth below, together with the accompanying drawings.

DETAILED DESCRIPTION

Figure 1:
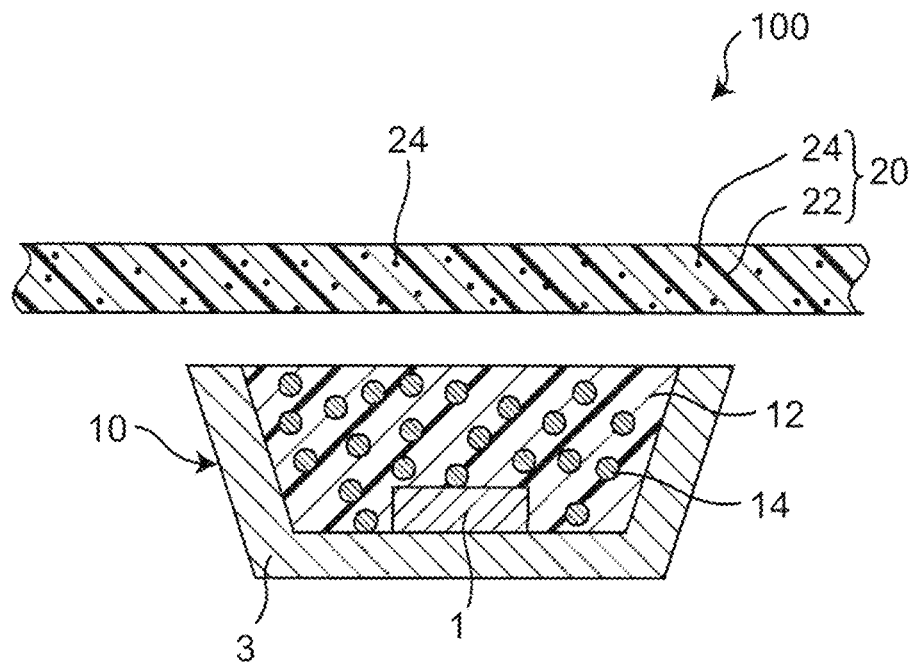
FIG. 1 shows a schematic cross-sectional view of a light emitting device 100 according to a first embodiment.

In the following, embodiments of the present invention will be described with reference to the accompanying drawings. It is understood that the embodiments described below are to embody the technical concept of the present invention, and not intended to limit the scope of the present invention. The arrangements mentioned in one embodiment can also be applied to other embodiments, unless otherwise specified. In the description below, if necessary, the terms indicative of the specific direction or position (for example, "upper", "lower", "right", "left", and other words including these words) are used for easy understanding of the present invention with reference to the figures. The meanings of the terms are not intended to restrict the technical range of the present invention.

It is understood that in some drawings, the sizes or positional relationships of members are emphasized to clarify the description below and are not limiting. The same parts or members are designated by the same reference character throughout the drawings. Further, a member denoted by a combination of a numerical number and a letter, for example, a reference character "10A", may have the same structure as that of a member denoted by the same numerical number without any letter, for example, a reference character "10", or that of a member denoted by a combination of the same numerical number and a different letter unless otherwise specified.

As a result of intensive studies, the inventors have discovered that when used in place of the red quantum dots, at least one of a KSF phosphor and a MGF phosphor as the red phosphor allows for obtaining high luminous efficiency in the light emitting device that employs the green quantum dots. The KSF phosphors and the MGF phosphors to be described in detail below absorb blue light emitted from the light emitting element and emit red light, and absorb little green light emitted from the green quantum dots. That is, the secondary absorption is reduced or does not occur. Thus, the light emitting devices according to the embodiments of the present invention have high luminous efficiency. The peak of the emission spectrum of each of the KSF phosphors and the MGF phosphors has a narrow full width at half maximum of about 10 to 20 nm. Accordingly, red light having a narrow full width at half maximum can be obtained even through a color filter that allows the light in the substantially whole red wavelength range to pass therethrough, so that red light of high color purity can be obtained.

The term "quantum dot" in the present specification refers to a wavelength converting material using a quantum size effect of ultrafine semiconductor particles (semiconductor nanoparticles). It is known that the ultrafine particles of semiconductor having a particle size of, e.g., tens of nanometers or less, exhibit a quantum size effect.

The term "quantum size effect" refers to a phenomenon that the respective bands of a valence band and a conduction band, which are continuous in bulk particles, become discrete with the particle size of the order of nano-meters, and a band gap energy varies depending on the particle size. Such semiconductor nanoparticles that exhibit the quantum size effect absorb light and emit light corresponding to the band gap energies, and thus can be used as the wavelength converting material in the light emitting devices.

Light emitting devices according to multiple embodiments of the present invention will be described below in detail.

1. First Embodiment

FIG. 1 shows a schematic cross-sectional view of a light emitting device 100 according to a first embodiment. The light emitting device 100 includes a light emitting element 1 adapted to emit a blue light, green quantum dots 24 to absorb a portion of the blue light emitted from the light emitting element 1 to emit a green light, and particles of a red phosphor 14 to absorb a portion of the blue light emitted from the light emitting element 1 to emit a red light. The red phosphor 14 is at least one of a KSF phosphor and a MGF phosphor, discussed in detail below.

In the light emitting device according to embodiments of the present invention, the positional relationships between the red phosphor particles 14 and the green quantum dots 24 with respect to the light emitting element 1 is not specifically limited. For example, the red phosphor particles 14 may be arranged closer than the green quantum dots 24. Alternatively, the red phosphor particles 14 may be arranged farther than the green quantum dots 24. Further, in an embodiment that will be described below, the red phosphor particles 14 and the green quantum dots 24 may be arranged at approximately same distance from the light emitting element 1. In the first embodiment, the red phosphor particles 14 are arranged closer than the green quantum dots 24.

The light emitting device 100 includes a light emitting element package 10. The light emitting element package 10 includes a resin package 3 having a bottom surface and sidewalls that define a cavity opening upward, a light emitting element 1 disposed on the bottom surface in the cavity of the resin package 3, and a sealing resin 12 filled in the cavity of the resin package 3. The light emitting element 1 has its positive electrode and negative electrode connected to an external power source via conductive members, such as a metal wire, a metal bump or a plated member. Upon being supplied with electric current (electric power) from the external power source, the light emitting element 1 emits a blue light.

A lead may be disposed at the bottom surface in the cavity of the resin package 3, and the light emitting element 1 may be disposed on the lead. The lead may be connected to the negative electrode and/or the positive electrode by a metal wire, to connect the light emitting element 1 to the external power source via the lead. Instead of using the metal wire, flip-chip bonding can be formed with the use of a solder. The lead may have a plated layer on its surface as needed.

The sealing resin 12 covers the light emitting element 1. As shown in the embodiment illustrated in FIG. 1, the sealing resin 12 covers the upper surface and the side surfaces of the light emitting element 1 except for its bottom surface.

The sealing resin 12 contains the red phosphor 14, and the red phosphor particles 14 are distributed substantially evenly in the sealing rein 12. Note that although in the embodiment shown in FIG. 1, the red phosphor particles 14 are substantially uniformly dispersed in the sealing resin 12, the distribution of the red phosphor particles is not limited thereto. Alternatively, the red phosphor particles 14 may be disposed at a higher density in a portion of the sealing resin 12. For example, the red phosphor particles 14 may be disposed at a high density near the light emitting element 1. One example of such an arrangement may be called a "sedimentation arrangement," in which the distribution density of the red phosphor particles is smaller at an upper part of the sealing resin 12 and higher at the bottom of the sealing resin 12 (including a portion directly above the light emitting element 1). The sedimentation arrangement can be formed, for example, by filling uncured sealing resin 12 with the red phosphor particles 14 uniformly distributed therein into the cavity of the resin package 3, standing the sealing resin 12 for a predetermined time while keeping it in the uncured state, allowing the red phosphor particles 14 in the sealing resin 12 to be gravitationally guided, and after the density of the red phosphor particles becomes high at the bottom of the sealing resin 12., then, hardening the sealing resin 12. Alternatively, the red phosphors may be settled out by a centrifugal force. In addition to the red phosphors 14, fillers may be distributed in the sealing resin 12.

The light emitting element package 10 has its upper surface serving as an emission surface and is configured to emit a blue light and a red light. A portion of the blue light emitted from the light emitting element 1 passes through the sealing resin 12 and is emitted from the upper surface of the sealing resin 12 to the outside. A portion of the blue light emitted from the light emitting element package 10 may be reflected at a side surface and/or the bottom surface of the resin package 3 while propagating inside the sealing resin 12, and then be emitted from the upper surface of the sealing resin 12. Another portion of the blue light emitted from the light emitting element 1 may be absorbed in the red phosphor particles 14 while propagating through the sealing resin 12, whereby the red phosphor particles 14 are excited to emit a red light. The red light emitted from the red phosphor particles 14 passes through the sealing resin 12 and is emitted from the upper surface of the sealing resin 12 toward the outside. A portion of the red light emitted from the red phosphor particles 14 is reflected at the side surfaces and/or the bottom surface of the resin package 3 while propagating through the sealing resin 12, and then is emitted from the upper surface of the sealing resin 12.

A green quantum dot-containing layer 20 is disposed outside the sealing resin 12, that is, in FIG. 1, over the sealing resin 12 (or resin package 3) in FIG. 1. The green quantum dot-containing layer 20 includes a light-transmissive material 22 and the green quantum dots 24. That is, the green quantum dots 24 are distributed in the light-transmissive material 22. The green quantum dot-containing layer 20 may have any form. One preferable form of the green quantum dot-containing layer 20 is a sheet shape (or film shape) as shown in FIG. 1. This is because the thickness of the green quantum dot-containing layer 20 can be made uniform to suppress color unevenness.

With this arrangement, in the light emitting device 100, the red phosphors 14 are positioned closer to the light emitting element 1 than the green quantum dots 24. The KSF phosphors or MGF phosphors having a large particle size (or diameter) of, e.g., 20 to 50 µm are disposed closer to the light emitting element, while the green quantum dots 24 having a particle size (or diameter) of, e.g., 2 to 10 nm are disposed near the light emitting element 1. Such an arrangement may suppress the scattering of light, including the scattering of green light due to the presence of the red phosphors 14, resulting in further improving the light extraction efficiency (that is, luminous efficiency). The improvement of the light extraction efficiency will be described in detail below after description of the structure of the following second embodiment.

A large portion of the red light emitted from the upper surface of the light emitting element package 10 propagates into the green quantum dot-containing layer 20 from its lower surface, passes through the light-transmissive material 22 of the green quantum dot-containing layer 20, and then exits from the upper surface of the green quantum dot-containing layer 20 to the outside.

A large portion of the blue light emitted from the upper surface of the light emitting element package 10 enters the green quantum dot-containing layer 20 from its lower surface. A portion of the blue light that has entered the green quantum dot-containing layer 20 from the lower surface passes through the light-transmissive material 22 of the green quantum dot-containing layer 20, and then exits from the upper surface of the green quantum dot-containing layer 20 to the outside. Another portion of the blue light that has entered the green quantum dot-containing layer 20 from its lower surface is partially absorbed in the green quantum dots 24, whereby the green quantum dots 24 emit green light. A large portion of the green light emitted from the green quantum dots 24 propagates through the light-transmissive material 22 and then exits from the upper surface of the green quantum dot-containing layer 20 to the outside. As a result, a white light that is a mixture of the blue light, the red light, and the green light can be obtained outside the upper surface of the green quantum dot-containing layer 20.

Note that a portion of the green light emitted from the green quantum dots 24 propagates downward and exits from the lower surface of the green quantum dot-containing layer 20, and then enters the sealing resin 12 from the upper surface of the light emitting element package 10. However, the red phosphor 14, which is at least one of a KSF phosphor and a MGF phosphor, hardly absorb the green light. Accordingly, a portion of green light emitted from the upper surface of the green quantum dot-containing layer 20 may be the light, for example, that is reflected at the inner surface of the resin package 3 and emitted from the upper surface of the light emitting element package 10, then enters the green quantum dot-containing layer 20 from its lower surface and then is emitted from the upper surface of the green quantum dot-containing layer 20. The presence of such green light contributes to improving the light extraction efficiency of the light emitting device 100.

In the embodiment shown in FIG. 1, the green quantum dot-containing layer 20 and the sealing resin 12 (or resin package 3) are spaced apart from each other. Thus, the light emitting device can have the effect of suppressing the transfer of heat generated from the light emitting element 1 to the green quantum dots 24, which are sensitive to heat.

The arrangement, however, is not limited thereto, and alternatively, the green quantum dot-containing layer 20 and the sealing resin 12 (or resin package 3) may be in contact with each other. In this embodiment, a larger amount of light emitted from the light emitting element package 10 is allowed to enter the green quantum dot-containing layer 20, so that the light extraction efficiency can be further improved. Moreover, even in an embodiment where the green quantum dot-containing layer 20 is in contact with the sealing resin 12 (or resin package 3), the light emitting element 1 is spaced apart from the green quantum dots 24 to some degree, so that thermal degradation of the green quantum dots 24 can be suppressed.

In the embodiment shown in FIG. 1, the light emitting element package 10 is a top-view type package in which the mounting surface is the bottom surface (lower surface); that is, the mounting surface is at the opposite side to the light extraction surface (for example, the upper surface serves as the light extraction surface and the lower surface serves as the mounting surface). However, the light emitting element package 10 is not limited thereto, and the light emitting element package 10 may be structured as a so-called side view type, in which a surface adjacent to the light extraction surface serves as the mounting surface.

In the embodiment shown in FIG. 1, the light emitting element package 10 that includes the resin package 3 is used, but is not limited thereto. In another embodiment, a "packageless type" may be employed in place of the light emitting element package 10, in which a phosphor layer containing the red phosphor particles 14 is formed on the surface of the light emitting element 1 without having a resin package.

Figure 2:
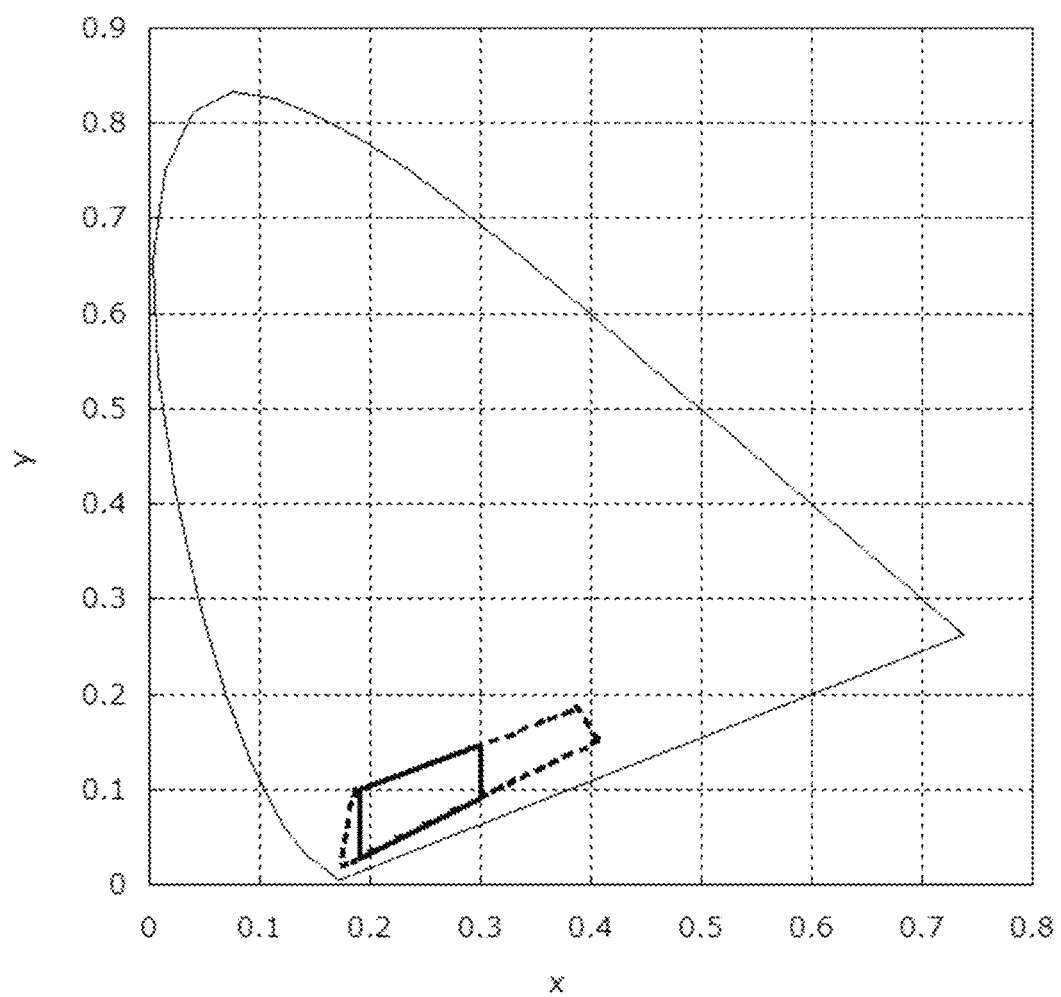
FIG. 2 shows preferable chromaticity ranges for light emitted from a light emitting element package 10 on chromaticity coordinate.

FIG. 2 is a diagram showing preferable chromaticity ranges of the light emitted from embodiments of the light emitting element package 10 (i.e. the light entering the green quantum dot-containing layer 20) on chromaticity coordinates. The chromaticity of light emitted from the light emitting element package 10 is preferably in a quadrangular region indicated by dashed lines in FIG. 2 (i.e. a quadrangular region formed by connecting four points of (0.4066, 0.1532), (0.3858, 0.1848), (0.1866, 0.0983) and (0.1706, 0.0157) on xy chromaticity coordinate system of CIE1931 chromaticity diagram).

The chromaticity of light emitted from the light emitting element package 10 is more preferably in a quadrangular region indicated by solid lines in FIG. 2 (i.e. a quadrangular region formed by connecting four points of (0.19, 0.0997), (0.19, 0.027013), (0.3, 0.09111) and (0.3, 0.014753) on xy chromaticity coordinate system of CIE1931 chromaticity diagram).

With the chromaticity within such regions, under the presence of the green quantum dot-containing layer 20, a color tone suitable for back light can be achieved.

A light emitting element package 10 to emit light of the chromaticity within those regions were prepared and the emission spectrum were measured, as described below.

Figure 3A:
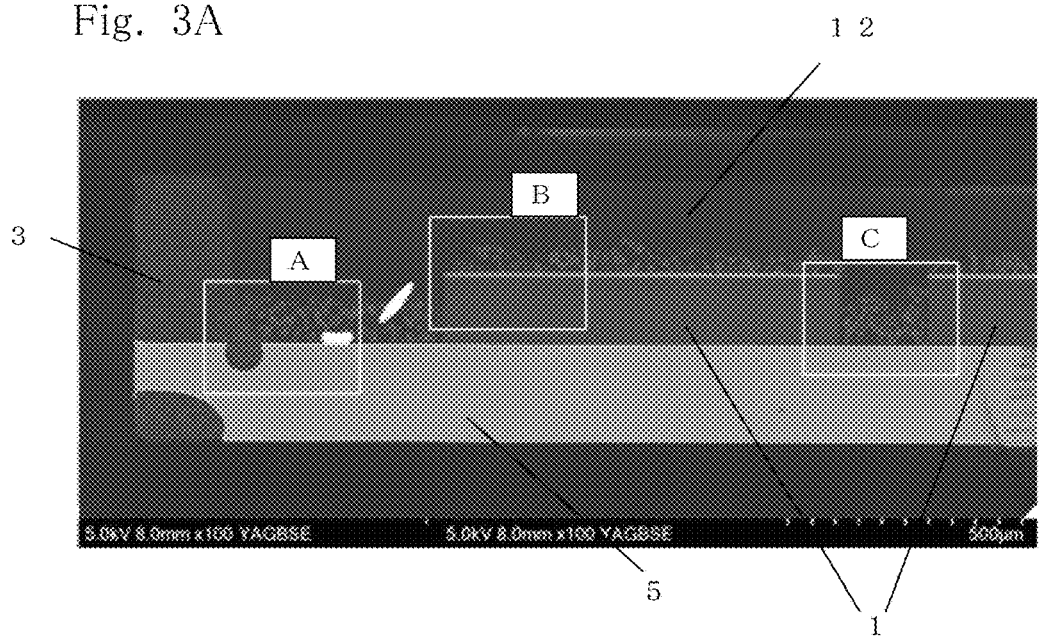
FIG. 3A shows a SEM image of a cross section of part of a thus obtained light emitting element package 10.
Figure 3B:
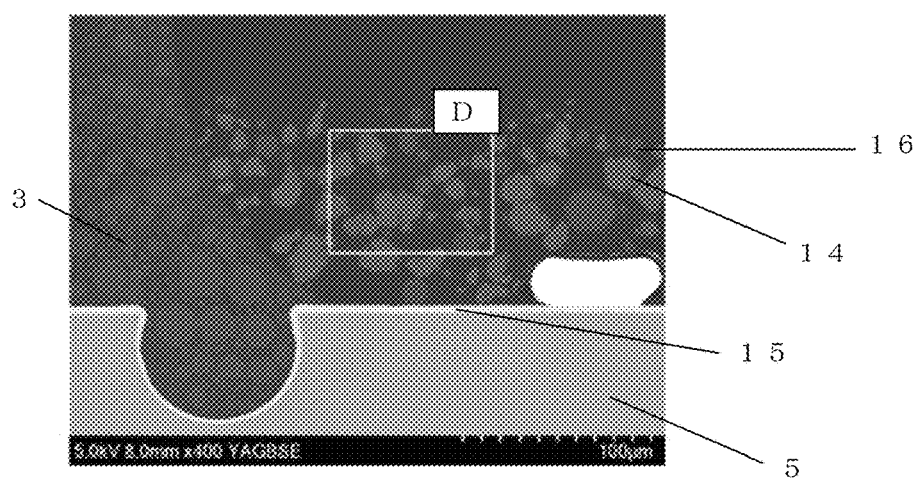
FIG. 3B shows an enlarged SEM image of portion A shown in FIG. 3A.
Figure 3C:
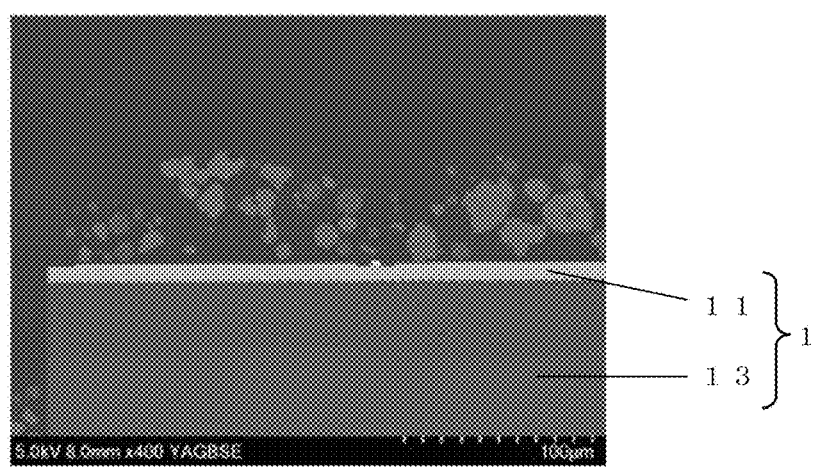
FIG. 3C shows an enlarged SEM image of portion B shown in FIG. 3A.
Figure 3D:
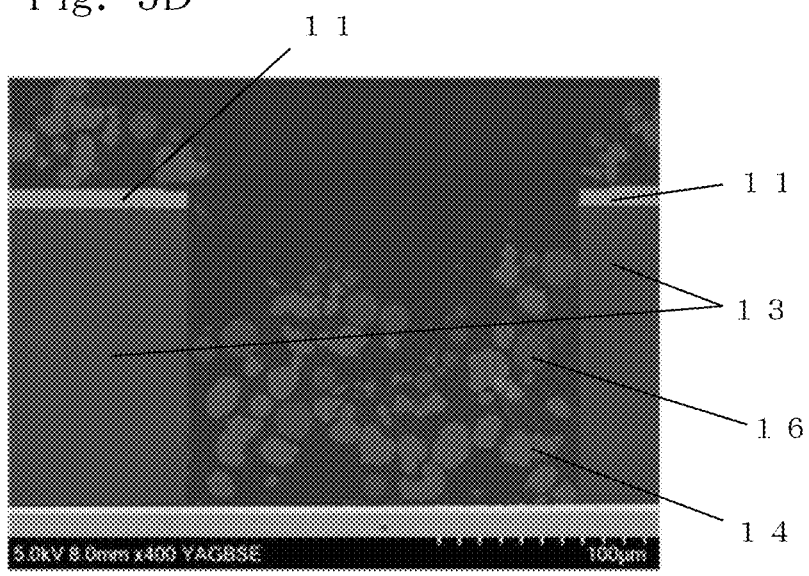
FIG. 3D shows an enlarged SEM image of portion C shown in FIG. 3A.
Figure 3E:
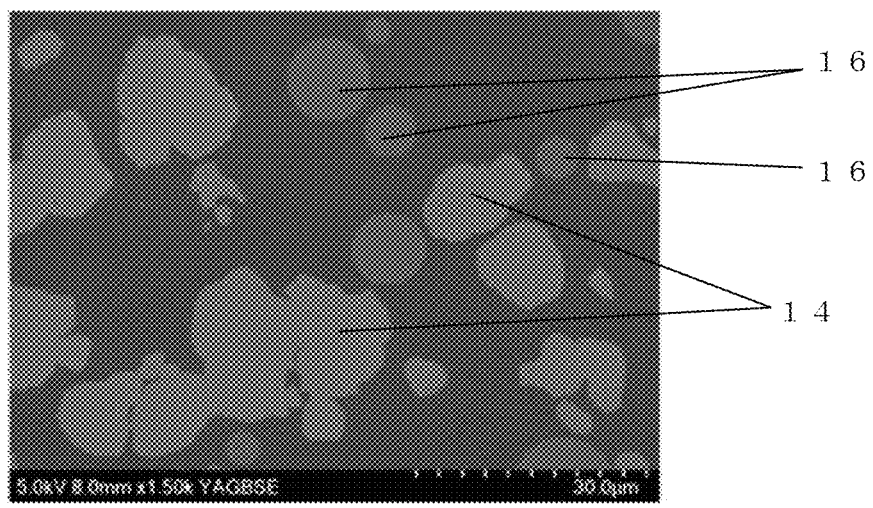
FIG. 3E shows an enlarged SEM image of portion D shown in FIG. 3B.

FIG. 3A shows a SEM image of a cross section of a portion of the light emitting element package 10. FIG. 3B shows an enlarged SEM image of the portion A shown in FIG. 3A. FIG. 3C shows an enlarged SEM image of the portion B shown in FIG. 3A. FIG. 3D shows an enlarged SEM image of the portion C shown in FIG. 3A, and FIG. 3E shows an enlarged SEM image of the portion D shown in FIG. 3B.

A resin package 3 was provided with a cavity defined in a substantially square shape with rounded corners in the top view, with an outside dimensions of 4 mm in length, 1.4 mm in width and 0.6 mm in height. The resin package 3 was provided with a pair of leads 5 on the bottom in the cavity, and each of the leads 5 had a plated layer on its surfaces. A light emitting element 1 having a light-transmissive substrate 13 and a semiconductor layer 11 was disposed on one of the pair of leads 5. The light emitting element 1 was electrically connected to the pair of leads 5 by gold wires, respectively. The light emitted from the light emitting element 1 has a peak of emission intensity between 435 nm and 465 nm.

The sealing resin 12 was disposed such that a silicon resin having the red phosphor particles 14 and the filler particles 15 distributed therein was disposed in the cavity of the resin package 3, and then, the red phosphor particles 14 and the filler particles 15 were centrifugally sedimented to form a sealing resin 12. For the red phosphor 14, a KSF phosphor ($K_2MnF_6$:$Mn^{4+}$) was used. For the filler 16, a silica filler and a nanosilica filler were used. The sealing resin 12 contained about 17 parts by weight of a KSF phosphor, about 5 parts by weight of a silica filler and about 0.4 parts by weight of a nanosilica filler with respect to 100 parts by weight of the silicone resin. As shown in FIG. 3C, an upper portion of a side surface of the light emitting element 1 was covered with neither the red phosphor 14 nor the filler 15.

Figure 4:
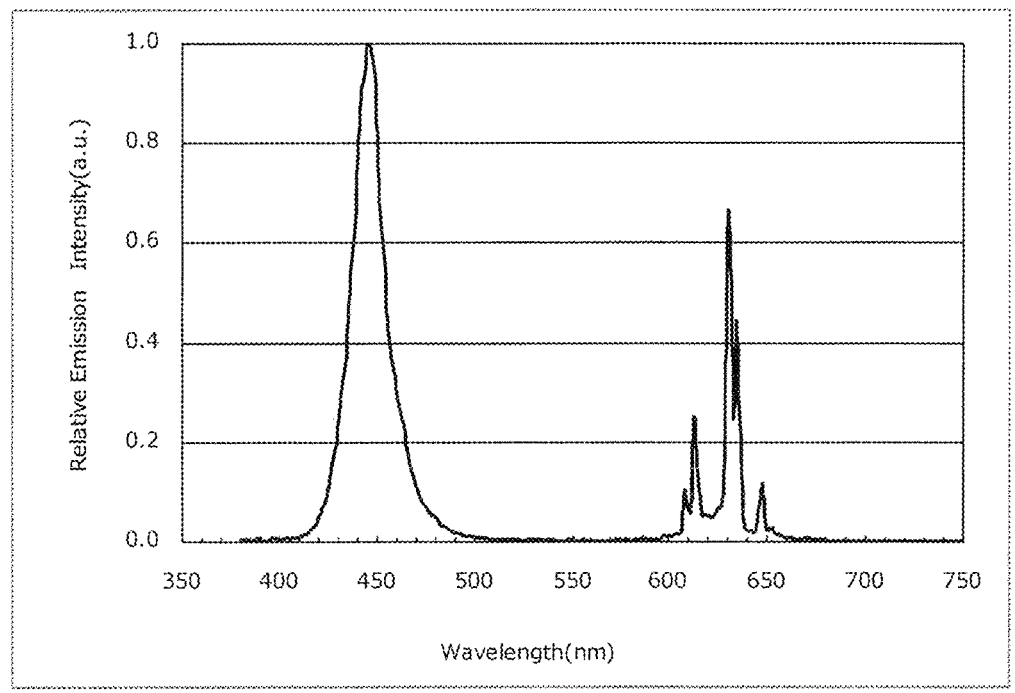
FIG. 4 shows an emission spectrum of the thus obtained light emitting element package 10.

FIG. 4 shows an emission spectrum of the light emitting element package 10 thus obtained. The light emitting element 1 emits light of a wavelength mainly between 430 nm and 480, and the red phosphor 14 emits light of a wavelength mainly between 600 nm and 660. The emission spectrum has a first peak wavelength at 447 nm at which the highest emission intensity is obtained, and a second peak wavelength at 631 nm at which the highest emission intensity of the red phosphor 14 is obtained. The ratio of the emission intensity at the first wavelength of the emission peak to the emission intensity at the second wavelength of the emission peak is 100:67 (i.e. the first emission intensity:the second emission intensity=100:67). The values of chromaticity coordinates in the CIE 1931 system were x=0.216 and y=0.054.

Next, the respective elements of the light emitting device 100 will be described in detail.

1) Light Emitting Element

The light emitting element 1 may be of any appropriate known light emitting element or blue LED chip, as long as it can emit a blue light (with the emission peak wavelength in a range of 435 to 465 nm). The light emitting element 1 may include a semiconductor stacked-layer body, and preferably includes a nitride semiconductor stacked-layer body. The semiconductor stacked-layer body (preferably, nitride semiconductor stacked-layer body) may include a first semiconductor layer (for example, an n-type semiconductor layer), an emission layer, and a second semiconductor layer (for example, a p-type semiconductor layer) in this order. For example, $In_XAl_YGa_{1-X-Y}N$ ($0 \leq X$, $0 \leq Y$, $X+Y \leq 1$) may be suitably used for a nitride semiconductor material. The thickness and the layer structure of each layer may be determined in a manner known to those skilled in the art.

2) Red Phosphor

The red phosphor 14 is at least one of a KSF phosphor and a MGF phosphor. The KSF phosphors and the MGF phosphors hardly absorb green light, and thus are advantageous that secondary absorption hardly occurs. The red phosphors have a half-width of the emission peak of 35 nm or less, and preferably 10 nm or less. The KSF phosphors and the MGF phosphors will be described in detail below.

(KSF Phosphors)

The KSF phosphors are a red phosphor having the wavelength of the emission peak in a range of 610 to 650 nm. The composition of the KSF phosphors is represented by the following chemical formula (1):

$$A_2[M_{1-a}M^{4+}{}_aF_6] \quad (1)$$

where A is at least one selected from the group consisting of $K^+$, $Li^+$, $Na^+$, $Rb^-$, $Cs^+$ and $NH^{4+}$; M is at least one element selected from the group consisting of Group 4 elements and Group 14 elements; and a satisfies an inequality expression of $0<a<0.2$.

The full width at half maximum of the emission peak of the KSF phosphor is 10 nm or less. Examples of KSF phosphors are disclosed by Japanese Patent Application No. 2014-122887 and U.S. Pat. No. 9,120,972, filed by the applicant of the present application. The entire contents of Japanese Patent Application No. 2014-122887 and U.S. Pat. No. 9,120,972 are incorporated herein by reference.

One embodiment of a method of manufacturing a KSF phosphor will be described below. First, $KHF_2$ and $K_2MnF_6$ are weighed to attain a desired composition ratio. The weighed $KHF_2$ is dissolved in an HF aqueous solution thereby preparing a solution A. The weighed $K_2MnF_6$ is dissolved in the HF aqueous solution, thereby preparing a solution B. Further, an aqueous solution containing $H_2SiF_6$ is prepared to attain a desired composition ratio, producing a solution C containing the $H_2SiF_6$. Each of the solutions B and C is dripped into the solution A while stirring the solution A at room temperature. The solution containing the thus obtained precipitate is subjected to solid-liquid separation, washed with ethanol, and then dried to produce a KSF phosphor.

(MGF Phosphor)

The MGF phosphors are a red phosphor that emits a deep-red fluorescence. That is, the MGF phosphors are activated with $Mn^{4+}$ and have a wavelength of the emission peak of 650 nm or more, which is located at a longer wavelength side than the peak emission wavelength of the KSF phosphors. One example of the composition of the MGF phosphors is represented by the following chemical formula: $3.5MgO.0.5MgF_2.GeO_2:Mn^{4+}$. The MGF phosphors have a full width at half maximum of 15 nm to 35 nm.

In the MGF phosphors, Mg in MgO in the composition may be partially substituted by another element, such as Li, Na, K, Sc, Y, La, Ce, Pr, Nd, Pm, Sm, Eu, Gd, Tb, Dy, Ho, Er, Tm, Yb, Lu, V, Nb, Ta, Cr, Mo, W, or the like, and/or the Ge in $GeO_2$ may be partially substituted by another element, such as B, Al, Ga, In, or the like, in order to improve the luminous efficiency. It is preferable that substituting Mg and Ge by Sc and Ga, respectively, can further improve the emission intensity of light in a wavelength range of 600 to 670 nm, which is called a deep red.

The MGF phosphors are represented by the following chemical formula (2):

$$(x-a)MgO.(a/2)Sc_2O_3.yMgF_2.cCaF_2.(1-b)GeO_2.(b/2)Mt_2O_3:zMn^{4-} \quad (2)$$

where x, y, z, a, b, and c satisfy the following inequality expressions: $2.0 \leq x \leq 4.0$, $0<y<1.5$, $0<z<0.05$, $0 \leq a<0.5$, $0<b<0.5$, $0 \leq c<1.5$ and $y+c<1.5$, and Mt is at least one kind of element selected from Al, Ga and In.

In the chemical formula (2), a and b are set to satisfy the following inequality expressions: $0.05 \leq a \leq 0.3$, and $0.05 \leq b<0.3$. Thus, the brightness of the emitted red light can be improved. Examples of MGF phosphors are disclosed by Japanese Patent Application No. 2014-113515, Japanese Patent Application No. 2015-96952 and U.S. patent application Ser. No. 14/724,118, filed by the applicant of the present application. The entire contents of Japanese Patent Application No. 2014-113515, Japanese Patent Application No. 2015-96952 and U.S. patent application Ser. No. 14/724,118 are incorporated herein by reference.

One embodiment of a method of manufacturing a MGF phosphor in the embodiment of the present invention will be described below. First, MgO, $MgF_2$, $Sc_2O_3$, $GeO_2$, $Ga_2O_3$, and $MnCO_3$ are weighed as raw materials to attain the desired composition ratio. After mixing these raw materials together, the mixture is charged into a crucible and calcined at a temperature of 1000 to 1300° C. under atmosphere, thus producing a MGF phosphor. The ratio of the emission intensity at the peak wavelength of the light emitting element to the emission intensity at the peak wavelength the red phosphor is preferably 100:55 to 70 (i.e. the first:the second=100:55 to 70).

3) Green Quantum Dot

The green quantum dots 24 may be nano-sized particles of a semiconductor material. Examples thereof include a group II-VI, a group III-V, and a group IV-VI compound semiconductor nano-sized particles, more specifically, a nano-sized particles made of CdSe, a core-shell $CdS_xSe_{1-x}/ZnS$, and GaP. The green quantum dots 24 may have a particle size (average particle size), for example, of 1 to 20 nm. The green quantum dots 24 emit green light having a wavelength of the emission peak of e.g., 510 to 560 nm. A full width at half maximum of the emission peak wavelength of the green quantum dots 24 is small, namely 40 nm or less, and preferably 30 nm or less. The green quantum dots may be surface-modified or stabilized by a resin and the like, such as polymethyl methacrylate (PMMA). The term "particle size" as used herein means the particle size of a core part made of semiconductor material which does not contain the resin part or the like which is added for surface modification and stabilization.

4) Light-Transmissive Material

The light-transmissive material 22 allows the blue light, the green light and the red light to pass therethrough. The light-transmissive material allows transmittance of preferably 60% or more, more preferably 70% or more, still more preferably 80% or more, and most preferably 90% or more of the light emitted from the light emitting element 1 and incident on the light-transmissive material 22. Examples of suitable light-transmissive material 22 include, high strain point glass, soda glass ($Na_2O.CaO.SiO_2$), borosilicate glass ($Na_2O.B_2O_3.SiO_2$), forsterote ($2MgO.SiO_2$), lead glass ($Na_2O.PbO.SiO_2$), and alkali-free glass. Examples of suitable light-transmissive material 22 also include organic polymers (that may take the forms of polymer material, such as a plastic film, a plastic sheet, and a plastic substrate, each of which is made of a polymer material and has flexibility), the examples include, a polymethyl methacrylate (PMMA), a polyvinyl alcohol (PVA), a polyvinyl phenol (PVP), a polyethersulfone (PES), a polyimide, a polycarbonate (PC), a polyethylene terephthalate (PET), a polystyrene (PS), a polyethylene naphthalate (PEN), a cyclic amorphous polyolefin, a multifunctional acrylate, a multifunctional polyolefin, an unsaturated polyester, an epoxy resin and a silicone resin.

5) Sealing Resin

The sealing resin 12 allows the blue light and the red light to pass therethrough, and preferably also allows the green light to pass therethrough. The sealing resin 12 allows transmittance of preferably 60% or more, more preferably 70% or more, still more preferably 80% or more, and most preferably 90% or more of the light emitted from the light emitting element 1 and incident on the sealing resin 12. Examples of suitable materials for the sealing resin 12 include, a silicone resin, a modified silicone resin, an epoxy resin, a modified epoxy resin, a phenol resin, a polycarbonate resin, an acrylic resin, a TPX resin, a polynorbornene resin, or a hybrid resin containing one or more of these resins. Of these resins, the silicone resin is preferable because of its good resistance to light and heat. The epoxy resin is also a preferable resin.

6) Resin Package

The resin package 3 may be formed of any suitable resin. Examples of preferable resins include, a thermoplastic resin containing at least one of an aromatic polyamide resin, a polyester resin, and a liquid crystal resin; or a thermosetting resin containing at least one of an epoxy resin, a modified epoxy resin, a phenol resin, a silicone resin, a modified silicone resin, a hybrid resin, an acrylate resin, an urethane resin. The resin package 3 is preferably formed of a white resin. This is because of the light propagating through the sealing resin 12, more of the light reaching the resin package 3 can be reflected.

2. Second Embodiment

Figure 5:
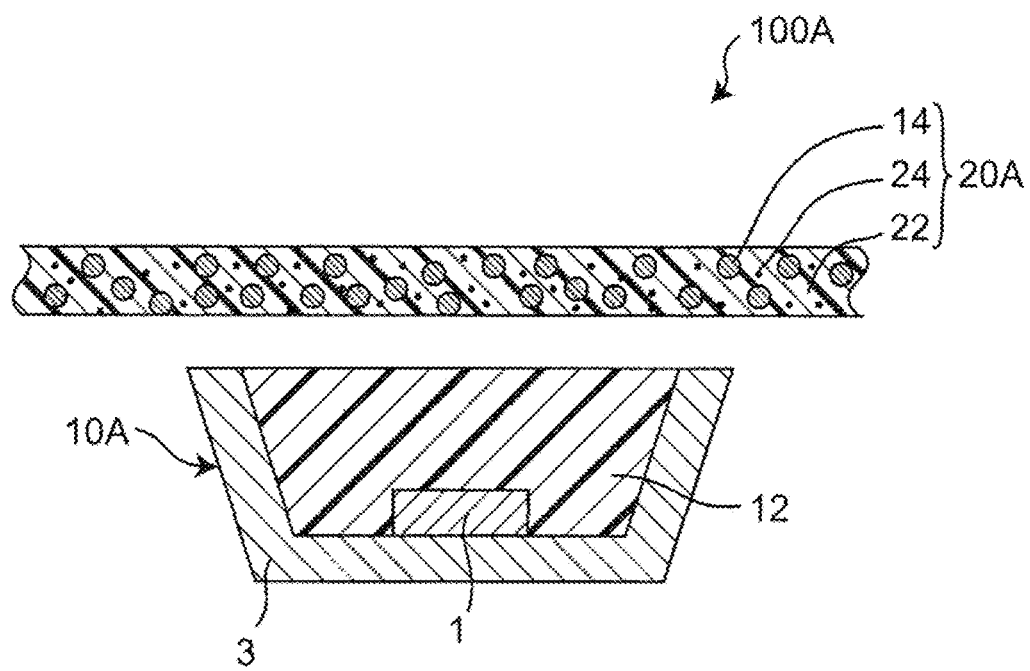
FIG. 5 shows a schematic cross-sectional view of a light emitting device 100A according to a second embodiment.

FIG. 5 shows a schematic cross-sectional view of a light emitting device 100A according to a second embodiment. In the above-mentioned light emitting device 100, the sealing resin 12 contains particles of a red phosphor 14. Meanwhile, in the light emitting device 100A, in place of the sealing resin 12 to contain the red phosphor particles 14, the light-transmissive material 22 contains the red phosphor particles 14. Thus, the red phosphor particles 14 and the green quantum dots 24 are disposed in the light-transmissive material 22, accordingly, the red phosphor particles 14 and the green quantum dots 24 are positioned at substantially the same distance with respect to the light emitting element 1.

The light emitting element package 10A may have substantially similar structure as that of the light emitting element package 10 in the first embodiment except that the sealing resin 12 does not contain the red phosphor particles 14. A green quantum dot-containing layer 20A may have substantially similar structure as that of the green quantum dot-containing layer 20 in the first embodiment except that it contains not only the green quantum dots 24 but also the red phosphor particles 14.

As described above, in the light emitting device 100 of the first embodiment, with respect to the light emitting element 1, the red phosphor particles 14 are positioned closer than the green quantum dots 24, while in the light emitting device 100A of the second embodiment, the red phosphor particles 14 and the green quantum dots 24 are positioned substantially at the same distance with respect to the light emitting element 1. The respective embodiments have different advantages. These advantages will be described below.

1) Advantages of Light Emitting Device 100

Figure 6A:
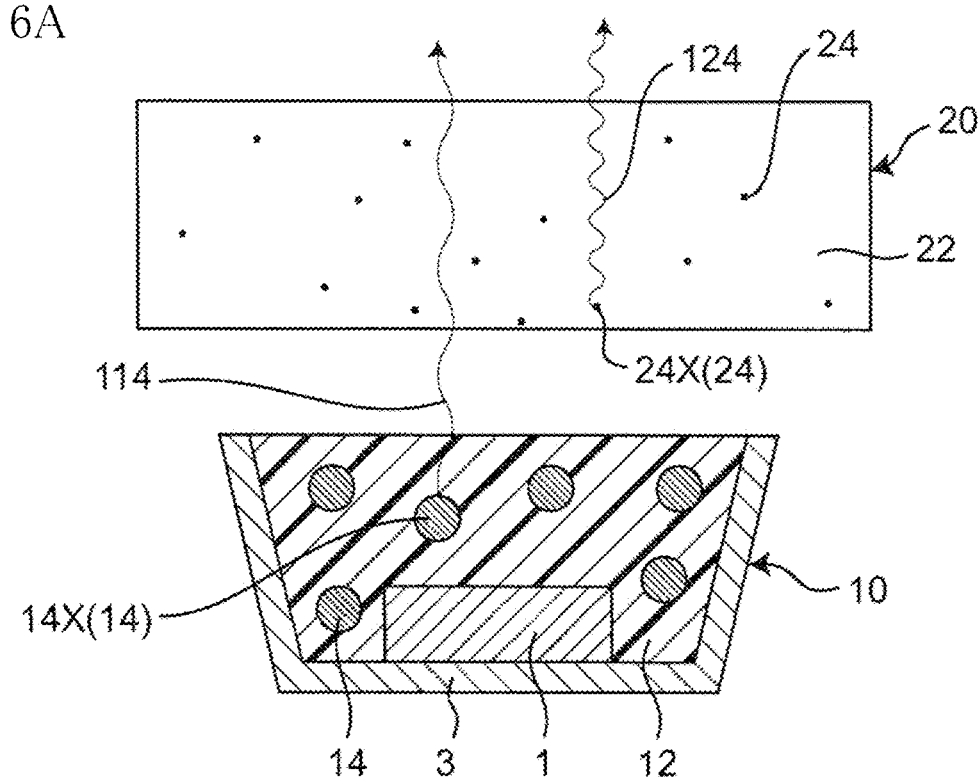
FIG. 6A is an exemplary cross-sectional view illustrating the advantages of the light emitting device 100, showing an embodiment of red phosphor particles 14 disposed in a sealing resin 12.
Figure 6B:
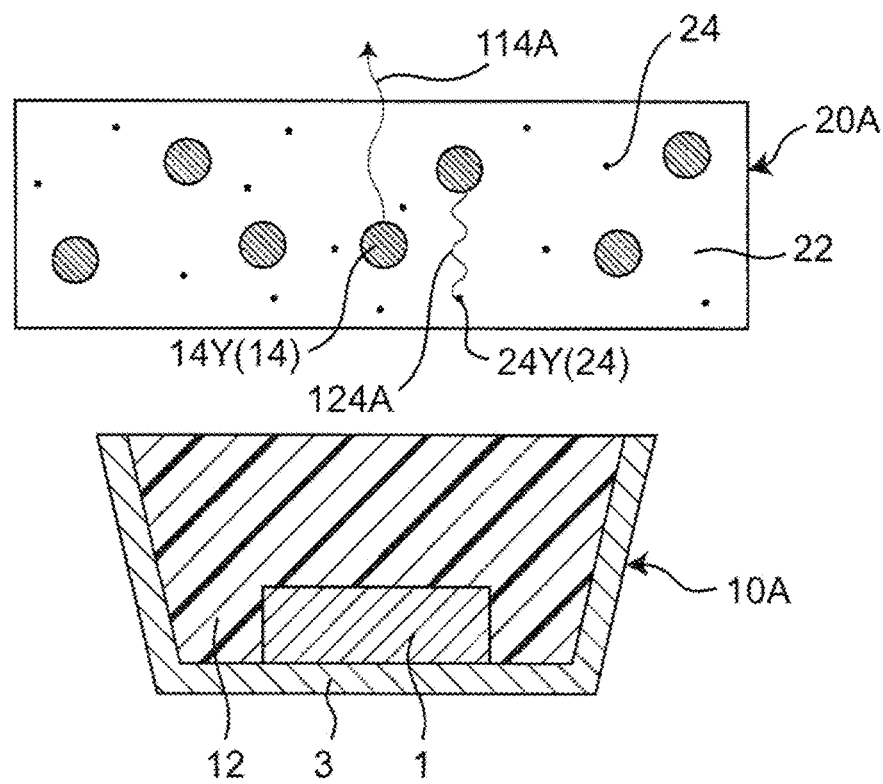
FIG. 6B is an exemplary cross-sectional view illustrating the advantages of the light emitting device 100A, showing an embodiment of red phosphor particles 14 disposed in a light-transmissive material 22.

FIGS. 6A and 6B are schematic cross-sectional views for illustrating the advantages of the light emitting devices 100 and 100A. FIG. 6A is a schematic cross-sectional view showing the embodiment of the red phosphor particles 14 disposed in the sealing resin 12. FIG. 6B is a schematic cross-sectional view showing another embodiment of the red phosphor particles 14 disposed in the light-transmissive material 22. As described above, the red phosphor 14 has a particle size of 20 to 50 μm, while the green quantum dots 24 have a particle size of 2 to 10 nm. These particle sizes differ significantly from each other, more specifically, the former is about three to four orders of magnitude greater than the latter.

FIGS. 6A and 6B are schematic diagrams illustrated for the purpose of clarifying the advantages of the light emitting devices 100 and 100A due to the difference in the particle sizes. In comparison with FIGS. 1 and 5, FIGS. 6A and 6B more clearly show the difference in the particle size between the red phosphor particles 14 and the green quantum dots 24.

Reference numeral 114 in FIG. 6A schematically represents red light (part of red light) emitted from a red phosphor particle 14X, which is one of a plurality of red phosphor particles 14, and reference numeral 124 schematically represents green light (part of green light) emitted from a green quantum dot 24X, which is one of a plurality of green quantum dots 24. Likewise, reference numeral 114A in FIG. 6B schematically represents red light (part of red light) emitted from a red phosphor particle 14Y, which is one of a plurality of red phosphor particles 14, and reference numeral 124A schematically represents green light (part of green light) emitted from a green quantum dot 24Y, which is one of a plurality of green quantum dots 24.

As shown in FIG. 6B, in the case where the red phosphor particles 14 having larger particle size are disposed in the light-transmissive material 22, the green light 124A emitted from the green quantum dots 24Y is scattered by the red phosphor particles 14 present in the path of the green light, and as a result, does not reach the upper surface of the green quantum dot-containing layer 20A (in FIG. 6B, the red light 114A exits from the upper surface of the green quantum dot-containing layer 20A to the outside, while the green light 124A does not reach the upper surface of the green quantum dot-containing layer 20A). The presence of the red phosphor particles 14 having a large particle size in the green quantum dot-containing layer 20A causes such scattering of a portion of the green light, which might slightly reduce the luminous efficiency.

On the other hand, as shown in FIG. 6A, the green quantum dot-containing layer 20 does not contain the red phosphor particles 14 having a large particle size, and contains only the green quantum dots 24 except for the light-transmissive material 22. The green light propagating through the green quantum dot-containing layer 20 is much less likely to be scattered by the green quantum dots 24 having a very small particle size (in FIG. 6A, the red light 114 and the green light 124 exit to the outside from the upper surface of the green quantum dot-containing layer 20). Thus, the higher luminous efficiency can be obtained.

2) Advantages of Light Emitting Device 100A

The green quantum dot-containing layer 20A of the light emitting device 100A contains both the red phosphor particles 14 and the green quantum dots 24 as described above. Although the red phosphor particles 14 have less thermal degradation compared to the green quantum dots 24, such an arrangement can suppress the transfer of heat generated from the light emitting element 1 to the red phosphor particles 14, accordingly, degradation of the red phosphor particles 14 can be more reliably suppressed.

Moreover, the red phosphor particles 14 and the green quantum dots 24 are arranged in the light-transmissive material 22, so that the wavelength converting material has to be disposed only in the light-transmissive material 22, and the red phosphor particles 14 are not needed to be disposed in the sealing resin 12. Accordingly, the manufacturing procedure can be simplified.

As described above, in the light emitting device 100A, the light-transmissive material 22 of the green quantum dot-containing layer 20A contains the red phosphor particles 14, and the sealing resin 12 of the light emitting element package 10A does not contain the red phosphor particles 14.

But alternatively, both the light-transmissive material 22 of the green quantum dot-containing layer 20A and the sealing resin 12 of the light emitting element package 10A may contain the red phosphor particles 14.

3. Third Embodiment

Figure 7:
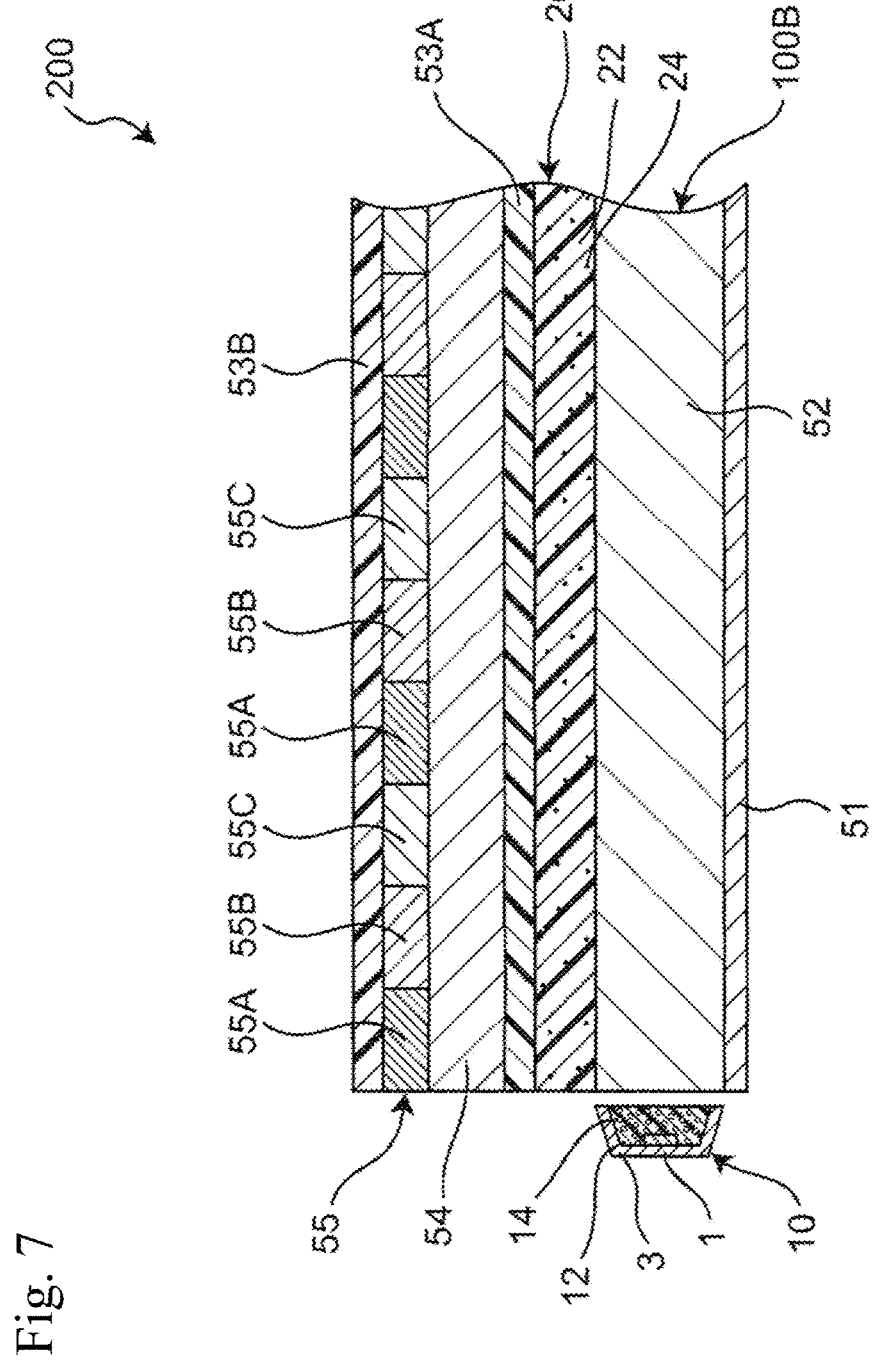
FIG. 7 is a schematic cross-sectional view showing a liquid crystal display device 200 that has a light emitting device 100B according to a third embodiment.

FIG. 7 is a schematic cross-sectional view showing a liquid crystal display device 200 that has a light emitting device 100B according to a third embodiment. The light emitting device 100B includes the light emitting element package 10, the green quantum dot-containing layer 20, and a light guide plate 52 disposed between the light emitting element package 10 and the green quantum dot-containing layer 20. In the embodiment shown in FIG. 7, the light guide plate 52 is disposed between the sealing resin 12 of the light emitting element package 10 and the green quantum dot-containing layer 20. More specifically, the sealing resin 12 is arranged facing one side surface of the light guide plate 52, and the green quantum dot-containing layer 20 is disposed facing the upper surface of the light guide plate 52. In the embodiment shown in FIG. 7, the light emitting element package 10 is of a top-view type, but is not limited thereto, and may have any other form, such as the side-view type mentioned above.

The light emitting device 100B may include a reflecting plate (reflector) 51 on the lower surface of the light guide plate 52 to upwardly reflect a portion of the light entering the light guide plate 52 through the light emitting element package 10 and reaching the lower surface of the light guide plate 52, and then to direct the reflected light toward the upper surface of the light guide plate 52.

In the embodiment shown in FIG. 7, the light emitting element package 10 is disposed spaced apart from the light guide plate 52, but is not limited thereto. The light emitting element package 10 and the light guide plate 52 may be arranged in contact with each other by, for example, arranging the sealing resin 12 or the resin package 3 in contact with the side surface of the light guide plate 52. The green quantum dot-containing layer 20 may be arranged in contact with the upper surface of the light guide plate 52, or spaced apart from the light guide plate 52.

A lower polarizing film 53A is disposed on the green quantum dot-containing layer 20. A liquid crystal cell 54 is disposed on the lower polarizing film 53A, and a color filter array 55 is disposed on the liquid crystal cell 54. The color filter array 55 includes a plurality of color filter portions corresponding to different colors, each filter portion allowing only the light of a specific color to pass therethrough. The color filter portions include, for example, red color filter portions 55A, green color filter portions 55B and blue color filter portions 55C. An upper polarizing film 53B is disposed on the color filter array 55.

Next, the operation of the liquid crystal display device 200 will be described.

A portion of blue light emitted from the light emitting element 1 exits from the sealing resin 12. Another portion of the blue light emitted from the light emitting element 1 is absorbed in the red phosphor particles 14 disposed in the sealing resin 12, and then red light is emitted from the red phosphor particles 14. The red light emitted from the red phosphor particles 14 exits through the sealing resin 12. That is, a purple light, which is a mixture of the blue light and the red light, is emitted from the light emitting element package 10. The purple light (blue light+red light) enters the green quantum dot-containing layer 20 via the light guide plate 52. A portion of the blue light entering the green quantum dot-containing layer 20 is absorbed in the green quantum dots 24, whereby the green quantum dots 24 emit a green light. As a result, a white light which is a mixture of the blue light, the green light, and the red light is emitted from the upper surface of the green quantum dot-containing layer 20. The white light enters the lower polarizing film 53A. A portion of the white light (blue light+green light+red light) entering the lower polarizing film 53A passes through the lower polarizing film 53A to enter the liquid crystal cell 54. A portion of the white light entering the liquid crystal cell 54 passes through the liquid crystal cell 54 to reach the color filter array 55.

The blue light, the green light and the red light reaching the color filter array 55 can pass through the corresponding filter portion. For example, the red light passes through the red color filter portions 55A, the green light passes through the green color filter portions 55B, and the blue light passes through the blue color filter portions 55C. Each of the blue, green and red lights passing through the color filter array 55 can partially pass through the upper polarizing film 53B. In this way, the liquid crystal display device 200 can display a desired image.

As described above, each of the red light emitted from the red phosphor 14 and the green light emitted from the green quantum dots 24 has a narrow full width at half maximum of the emission peak, and thus has the high color purity. Also, larger amount of light can pass through the red color filter portions 55A and the green color filter portions 55B, so that the luminous efficiency can be improved.

Although the disclosure has been described with reference to several exemplary embodiments, it shall be understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular examples, means, and embodiments, the disclosure may be not intended to be limited to the particulars disclosed; rather the disclosure extends to all functionally equivalent structures, methods, and uses such as are within the scope of the appended claims.

The illustrations of the examples and embodiments described herein are intended to provide a general understanding of the various embodiments, and many other examples and embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more examples or embodiments of the disclosure may be referred to herein, individually and/or collectively, by the term "disclosure" merely for convenience and without intending to voluntarily limit the scope of this application to any particular disclosure or inventive concept. Moreover, although specific examples and embodiments have been illustrated and described herein, it should be appreciated that any subsequent arrangement designed to achieve the same or similar purpose may be substituted for the specific examples or embodiments shown. This disclosure may be intended to cover any and all subsequent adaptations or variations of various examples and embodiments. Combinations of the above examples and embodiments, and other examples and embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure may be not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter shall be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure may be determined by the broadest permissible interpretation of the following claims and their equivalents, and shall not be restricted or limited by the foregoing detailed description.

All of the publications, patent applications and patents cited herein are incorporated herein by reference in their entirety.

What is claimed is:

1. A light emitting device, comprising:
a light emitting element adapted to emit blue light;
a plurality of quantum dots adapted to absorb a portion of the blue light emitted from the light emitting element to emit green light;
at least one of a KSF phosphor and a MGF phosphor, the KSF phosphor being adapted to absorb a portion of the blue light emitted from the light emitting element to emit red light, and the MGF phosphor being adapted to absorb a portion of the blue light emitted from the light emitting element to emit red light;
a sealing resin covering the light emitting element; and
a quantum dot layer disposed outside the sealing resin, the quantum dot layer including a light-transmissive material and the quantum dots having a particle size of 1 to 20 nm, wherein the KSF phosphor is a compound having the chemical formula:

$$A_2[M_{1-a}Mn^{4+}_aF_6] \quad (1)$$

where A is at least one selected from the group consisting of $K^+$, $Li^+$, $Na^+$, $Rb^+$, $Cs^+$, and $NH^+$, M is at least one element selected from the group consisting of Group 4 elements and Group 14 elements, and
$0<a<0.2$;
wherein the MGF phosphor is a compound having the chemical formula:

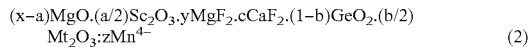

$$(x-a)MgO.(a/2)Sc_2O_3.yMgF_2.cCaF_2.(1-b)GeO_2.(b/2)Mt_2O_3:zMn^{4-} \quad (2)$$

wherein
$2.0 \leq x \leq 4.0$,
$0<y<1.5$,
$0<z<0.05$,
$0 \leq a<0.5$,
$0<b<0.5$,
$0 \leq c<1.5$,
$y+c<1.5$, and
Mt is at least one element selected from Al, Ga and In;
wherein the light emitting element and the sealing resin constitute a part of a light emitting element package;
wherein the quantum dot layer is spaced apart from the light emitting element package including the sealing resin so that transfer of heat generated from the light emitting element to the quantum dots is suppressed; and
wherein the sealing resin includes at least one of the KSF phosphor and the MGF phosphor.

2. The light emitting device according to claim 1, wherein the sealing resin includes the KSF phosphor.

3. The light emitting device according to claim 2, wherein a light guide plate is disposed between the sealing resin and the quantum dot layer.

4. The light emitting device according to claim 3, wherein the sealing resin is disposed facing one side surface of the light guide plate, and the quantum dot layer is disposed facing an upper surface of the light guide plate.

5. The light emitting device according to claim 1, wherein the quantum dot layer is sheet-shaped.

6. The light emitting device according to claim 5, wherein a light guide plate is disposed between the sealing resin and the quantum dot layer.

7. The light emitting device according to claim 6, wherein the sealing resin is disposed facing one side surface of the light guide plate, and the quantum dot layer is disposed facing an upper surface of the light guide plate.

8. The light emitting device according to claim 1, wherein the quantum dot layer does not include the KSF phosphor and the MGF phosphor.

9. The light emitting device according to claim 1, wherein the sealing resin further includes fillers.

10. The light emitting device according to claim 1, wherein chromaticity of light emitted from the light emitting element package is in a quadrangular region formed by connecting four points of (0.4066, 0.1532), (0.3858, 0.1848), (0.1866, 0.0983) and (0.1706, 0.0157) on xy chromaticity coordinate system of CIE1931 chromaticity diagram.

11. The light emitting device according to claim 1, wherein chromaticity of light emitted from the light emitting element package is in a quadrangular region formed by connecting four points of (0.19, 0.099779), (0.19, 0.027013), (0.3, 0.09111) and (0.3, 0.14753) on xy chromaticity coordinate system of CIE1931 chromaticity diagram.

12. The light emitting device according to claim 1, wherein the sealing resin includes the KSF phosphor, and wherein the quantum dot is made of CdSe or a core-shell $CdSxSe_{1-x}$/ZnS.

13. The light emitting device according to claim 1, wherein the KSF phosphor or the MGF phosphor have a particle size of 20μm to 50μm.

* * * * *